United States Patent
Omura

(10) Patent No.: US 11,309,866 B2
(45) Date of Patent: Apr. 19, 2022

(54) ACOUSTIC WAVE DEVICE AND METHOD FOR MANUFACTURING ACOUSTIC WAVE DEVICE

(71) Applicant: Murata Manufacturing Co., Ltd., Nagaokakyo (JP)

(72) Inventor: Masashi Omura, Nagaokakyo (JP)

(73) Assignee: MURATA MANUFACTURING CO., LTD, Kyoto (JP)

( * ) Notice: Subject to any disclaimer, the term of this patent is extended or adjusted under 35 U.S.C. 154(b) by 84 days.

(21) Appl. No.: 16/822,066

(22) Filed: Mar. 18, 2020

(65) Prior Publication Data

US 2020/0220521 A1    Jul. 9, 2020

Related U.S. Application Data

(63) Continuation of application No. PCT/JP2018/035555, filed on Sep. 26, 2018.

(30) Foreign Application Priority Data

Sep. 27, 2017   (JP) .............................. JP2017-186736

(51) Int. Cl.
   *H03H 9/54*    (2006.01)
   *H03H 3/02*    (2006.01)
   (Continued)

(52) U.S. Cl.
   CPC .............. *H03H 9/542* (2013.01); *H03H 3/02* (2013.01); *H03H 9/02228* (2013.01); *H03H 9/568* (2013.01)

(58) Field of Classification Search
   CPC .... H03H 9/542; H03H 9/02228; H03H 9/568; H03H 3/02
   See application file for complete search history.

(56) References Cited

U.S. PATENT DOCUMENTS

2011/0316649 A1   12/2011   Link et al.
2013/0271238 A1   10/2013   Onda et al.
(Continued)

FOREIGN PATENT DOCUMENTS

JP    2012-519447 A    8/2012
JP    2013-223025 A    10/2013
(Continued)

OTHER PUBLICATIONS

Official Communication issued in International Patent Application No. PCT/JP2018/035555, dated Dec. 18, 2018.

*Primary Examiner* — Samuel S Outten
(74) *Attorney, Agent, or Firm* — Keating & Bennett, LLP

(57) ABSTRACT

An acoustic wave device includes a first acoustic impedance layer and a second acoustic impedance layer, an IDT electrode, and an electrode. At least a portion of the IDT electrode overlaps the first acoustic impedance layer. At least a portion of the electrode overlaps the second acoustic impedance layer. In each of the first acoustic impedance layer and the second acoustic impedance layer, at least one of a high acoustic impedance layer and a low acoustic impedance layer is a conductive layer. A capacitor is formed by using the conductive layer of the second acoustic impedance layer and the electrode. The conductive layer in the first acoustic impedance layer is electrically insulated from the conductive layer in the second acoustic impedance layer.

17 Claims, 6 Drawing Sheets

(51) Int. Cl.
*H03H 9/02* (2006.01)
*H03H 9/56* (2006.01)

(56) References Cited

U.S. PATENT DOCUMENTS

| | | | |
|---|---|---|---|
| 2014/0152146 A1* | 6/2014 | Kimura | H01L 41/1873 |
| | | | 310/313 B |
| 2017/0366160 A1 | 12/2017 | Kishimoto et al. | |
| 2017/0366163 A1 | 12/2017 | Kishimoto | |

FOREIGN PATENT DOCUMENTS

| | | |
|---|---|---|
| WO | 2016/147688 A1 | 9/2016 |
| WO | 2016/147986 A1 | 9/2016 |

\* cited by examiner

ACOUSTIC WAVE DEVICE AND METHOD FOR MANUFACTURING ACOUSTIC WAVE DEVICE

CROSS REFERENCE TO RELATED APPLICATIONS

This application claims the benefit of priority to Japanese Patent Application No. 2017-186736 filed on Sep. 27, 2017 and is a Continuation Application of PCT Application No. PCT/JP2018/035555 filed on Sep. 26, 2018. The entire contents of each application are hereby incorporated herein by reference.

BACKGROUND OF THE INVENTION

1. Field of the Invention

The present invention relates to an acoustic wave device and a method for manufacturing an acoustic wave device, and more particularly to an acoustic wave device to be used in a resonator or a filter and a method for manufacturing an acoustic wave device to be used in a resonator or a filter.

2. Description of the Related Art

Conventionally, an acoustic wave device using an acoustic reflection layer (acoustic impedance layer) has been known (see, for example, International Publication No. WO 2016/147688).

The acoustic wave device described in International Publication No. WO 2016/147688 includes a piezoelectric layer. An interdigital transducer (IDT) electrode is provided on a second main surface of the piezoelectric layer. Additionally, an acoustic reflection layer is laminated on a side of a first main surface of the piezoelectric layer. A support layer is laminated on a reinforcing substrate. In this support layer, a concave portion is provided which opens toward an upper surface. The concave portion is filled with an acoustic reflection layer. The acoustic reflection layer is provided at a position overlapping the IDT electrode when viewed in a plan view.

In a case where a capacitor is used together with the conventional acoustic wave device described in International Publication No. WO 2016/147688, when the capacitor that is a discrete element is used or the capacitor is formed on a surface of a substrate (on the second main surface of the piezoelectric layer), there is a problem in that the size thereof becomes large.

In order to solve the above problem, the inventor of preferred embodiments of the present application has provided the capacitor integrally with the acoustic wave device.

However, when the capacitor is integrally provided with the acoustic wave device, there is a problem in that an unnecessary capacitance component affects an IDT electrode of the acoustic wave device due to influence of the capacitor. As a result, characteristics of the acoustic wave device deteriorate.

SUMMARY OF THE INVENTION

Preferred embodiments of the present invention provide acoustic wave devices each of which is able to reduce the size while significantly reducing or preventing deterioration in characteristics, and method of manufacturing acoustic wave devices.

An acoustic wave device according to a preferred embodiment of the present invention includes a substrate, a first acoustic impedance layer and a second acoustic impedance layer, a piezoelectric layer, an IDT electrode, and at least one electrode. The first acoustic impedance layer and the second acoustic impedance layer are provided on the substrate. The piezoelectric layer is provided on the first acoustic impedance layer and the second acoustic impedance layer. The IDT electrode is provided on the piezoelectric layer. The IDT electrode at least partially overlaps the first acoustic impedance layer in a plan view from a thickness direction of the piezoelectric layer. The electrode is provided on the piezoelectric layer. The electrode at least partially overlaps the second acoustic impedance layer in a plan view from the thickness direction. Each of the first acoustic impedance layer and the second acoustic impedance layer includes a high acoustic impedance layer including at least one layer and a low acoustic impedance layer including at least one layer. An acoustic impedance of the low acoustic impedance layer is lower than that of the high acoustic impedance layer. In each of the first acoustic impedance layer and the second acoustic impedance layer, at least one of the high acoustic impedance layer and the low acoustic impedance layer is a conductive layer. A capacitor is defined by the conductive layer in the second acoustic impedance layer and the electrode. The conductive layer in the first acoustic impedance layer is electrically insulated from the conductive layer in the second acoustic impedance layer.

A method for manufacturing an acoustic wave device according to a preferred embodiment of the present invention includes preparing a substrate and a piezoelectric layer. The method for manufacturing the acoustic wave device includes forming a first acoustic impedance layer and a second acoustic impedance layer between the substrate and the piezoelectric layer. The first acoustic impedance layer includes at least one conductive layer. The second acoustic impedance layer includes at least one conductive layer. The method for manufacturing the acoustic wave device includes forming an IDT electrode and forming at least one electrode. In this process, the IDT electrode is formed on the piezoelectric layer, and at least partially overlaps the first acoustic impedance layer in a plan view from a thickness direction of the substrate. At least one electrode is formed on the piezoelectric layer, and at least partially overlaps the second acoustic impedance layer in a plan view from the thickness direction of the substrate. In the forming of the first acoustic impedance layer and the second acoustic impedance layer, forming a high acoustic impedance layer and forming a low acoustic impedance layer are repeated at least once for each forming process. An acoustic impedance of the low acoustic impedance layer is lower than that of the high acoustic impedance layer. In the forming of the first acoustic impedance layer and the second acoustic impedance layer, the conductive layer in the first acoustic impedance layer and the conductive layer in the second acoustic impedance layer are electrically insulated from each other. In the forming of the electrode, a capacitor is formed by the conductive layer in the second acoustic impedance layer and the electrode.

According to the acoustic wave devices and the methods for manufacturing the acoustic wave devices according to preferred embodiments of the present invention, it is possible to reduce the size while significantly reducing or preventing deterioration in characteristics of the acoustic wave devices.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
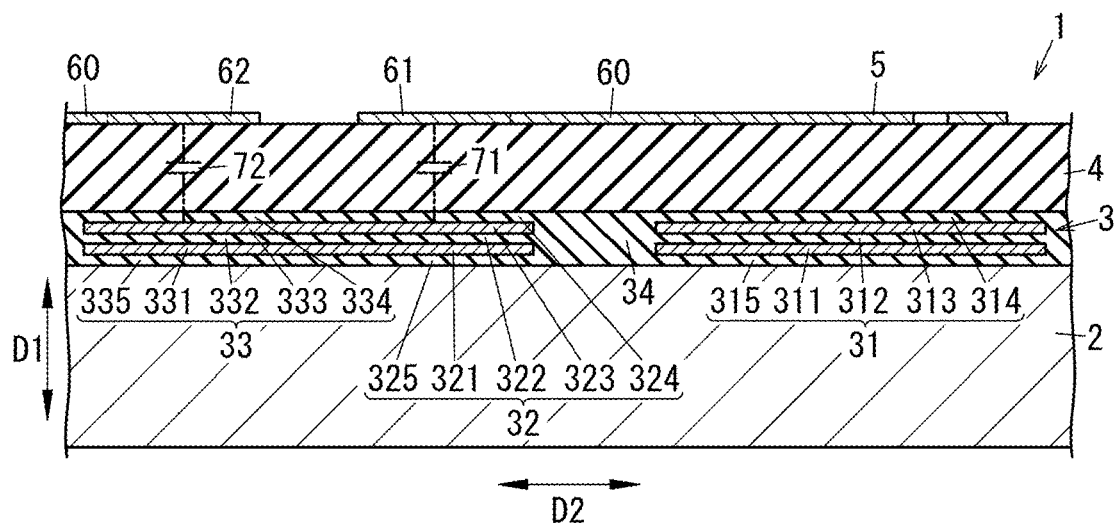
FIG. 1 is a cross-sectional view of an acoustic wave device according to a first preferred embodiment of the present invention.

Hereinafter, acoustic wave devices 1 and 1a and ladder filters 9 and 9a according to a first preferred embodiment of the present invention and a second preferred embodiment of the present invention will be described with reference to the drawings. It should be noted that the sizes and thicknesses described in the specification and drawings, as well as their dimensional relationships, are illustrative for the elements described in the specification and drawings, and are not limited to the examples shown in the specification and the drawings. Additionally, FIG. 1 is the cross-sectional view taken along a line X1-X1 in FIG. 2. FIG. 7 is the cross-sectional view taken along a line X2-X2 in FIG. 6.

First Preferred Embodiment (1) Overall Configuration of Acoustic Wave Device

Figure 2:
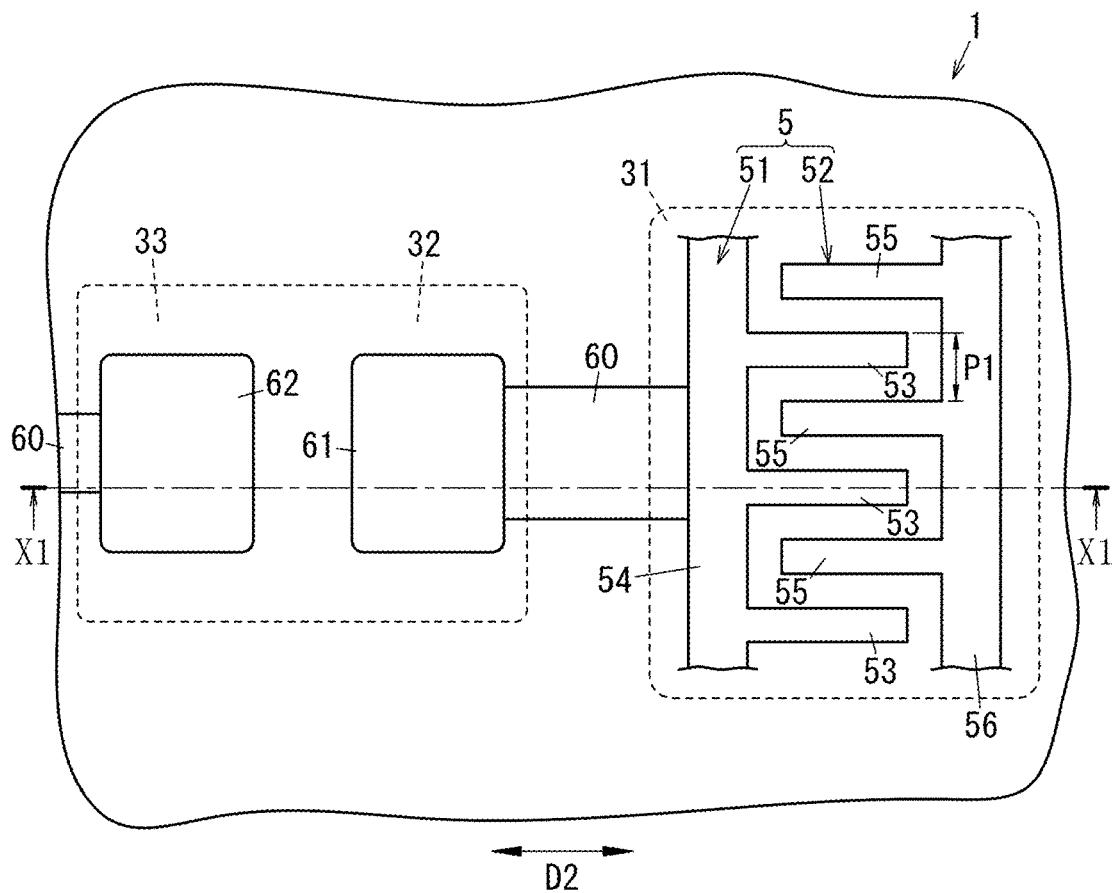
FIG. 2 is a front view of the acoustic wave device of FIG. 1.

As shown in FIG. 1 and FIG. 2, an acoustic wave device 1 according to a first preferred embodiment includes a substrate 2, an intermediate layer 3, a piezoelectric layer 4, an interdigital transducer (IDT) electrode 5, and a plurality of electrodes 61 and 62 (two electrodes in the shown example). The acoustic wave device 1 is an acoustic wave device using a plate wave.

The intermediate layer 3 includes a first acoustic impedance layer 31 and a plurality of second acoustic impedance layers 32 and 33. The first acoustic impedance layer 31 has a laminated structure including a plurality of first high acoustic impedance layers 311 and 313 and a plurality of first low acoustic impedance layers 312, 314, and 315, and faces the IDT electrode 5 in a thickness direction (first direction D1) of the substrate 2. The second acoustic impedance layer 32 has a laminated structure including a plurality of second high acoustic impedance layers 321 and 323 and a plurality of second low acoustic impedance layers 322, 324, and 325, and faces the electrode 61 in the thickness direction of the substrate 2. The second acoustic impedance layer 33 has a laminated structure including a plurality of second high acoustic impedance layers 331 and 333 and a plurality of second low acoustic impedance layers 332, 334, and 335, and faces the electrode 62 in the thickness direction of the substrate 2.

Additionally, in the acoustic wave device 1, the plurality of first high acoustic impedance layers 311 and 313 are first conductive layers having conductivity, and the plurality of second high acoustic impedance layers 321, 323, 331, and 333 are second conductive layers having conductivity.

Moreover, in the acoustic wave device 1, capacitors 71 and 72 for which the second conductive layers and the electrode 61 and 62 respectively define and function as a pair of electrodes are provided, and the first conductive layers are electrically insulated from the second conductive layers.

Figure 3:
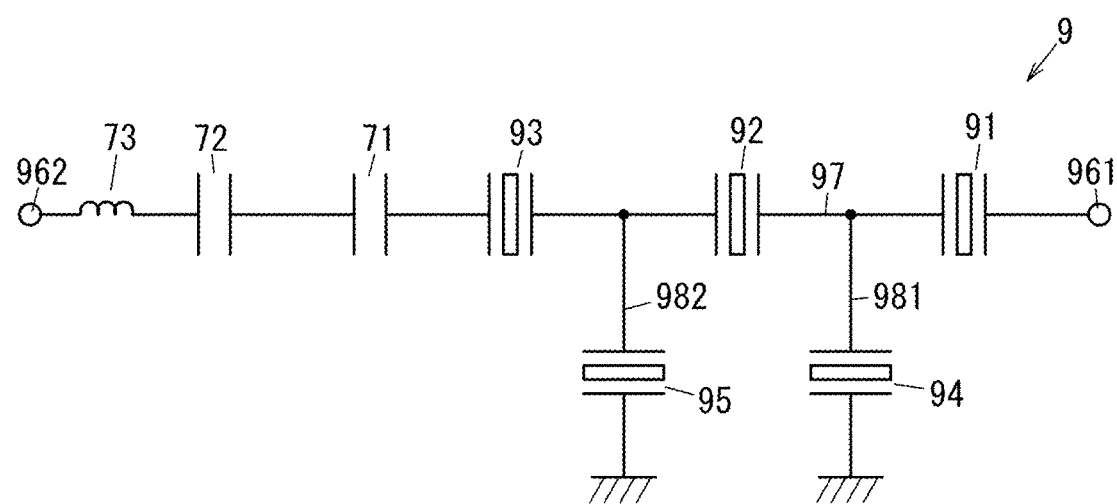
FIG. 3 is a circuit diagram of a ladder filter according to the first preferred embodiment of the present invention.

The acoustic wave device according to the first preferred embodiment may preferably be, for example, a filter such as the ladder filter 9 (see FIG. 3).

(2) Each Element of Acoustic Wave Device

Next, each element of the acoustic wave device according to the first preferred embodiment will be described with reference to the drawings.

(2.1) Substrate

The substrate 2 is a support substrate that supports the intermediate layer 3 and the piezoelectric layer 4. More specifically, the substrate 2 has a flat plate shape, and includes a main surface. The substrate 2 is preferably made of, for example, Si. The substrate 2 is not limited to Si, and may be made of a ceramic, for example, $LiNbO_3$ or $LiTaO_3$, quartz, glass, or the like. The first acoustic impedance layer 31 significantly reduces or prevents leakage of an acoustic wave excited by the IDT electrode 5 to the substrate 2.

(2.2) First Acoustic Impedance Layer and Second Acoustic Impedance Layer

The intermediate layer 3 includes the first acoustic impedance layer 31, the plurality of second acoustic impedance layers 32 and 33 (two second acoustic impedance layers in the shown example), and an insulating layer 34. The intermediate layer 3 is interposed between the substrate 2 and the piezoelectric layer 4. The intermediate layer 3 is provided on the substrate 2.

The first acoustic impedance layer 31 includes the plurality of first high acoustic impedance layers 311 and 313 (two layers in the shown example), and the plurality of first low acoustic impedance layers 312, 314, and 315 (three layers in the shown example). In the first acoustic impedance layer 31, in the thickness direction (first direction D1) of the substrate 2, the first low acoustic impedance layer 315, the first high acoustic impedance layer 311, the first low acoustic impedance layer 312, the first high acoustic impedance layer 313, and the first low acoustic impedance layer 314 are laminated in this order from a side of the substrate 2.

The first high acoustic impedance layers 311 and 313 each have a relatively high acoustic impedance. The first low acoustic impedance layers 312, 314, and 315 each have a relatively low acoustic impedance. That is, the acoustic impedances of the first high acoustic impedance layers 311 and 313 are higher than those of the first low acoustic impedance layers 312, 314, and 315.

Similarly to the first acoustic impedance layer 31, the second acoustic impedance layer 32 includes the plurality of second high acoustic impedance layers 321 and 323 (two layers in the shown example) and the plurality of second low acoustic impedance layers 322, 324, and 325 (three layers in the shown example). In the second acoustic impedance layer 32, in the thickness direction (first direction D1) of the substrate 2, the second low acoustic impedance layer 325, the second high acoustic impedance layer 321, the second low acoustic impedance layer 322, the second high acoustic impedance layer 323, and the second low acoustic impedance layer 324 are laminated in this order from the side of the substrate 2.

The second high acoustic impedance layers 321 and 323 each have a relatively high acoustic impedance. The second low acoustic impedance layers 322, 324, and 325 each have a relatively low acoustic impedance. That is, the acoustic impedances of the second high acoustic impedance layers 321 and 323 are higher than those of the second low acoustic impedance layers 322, 324, and 325. In other words, the acoustic impedances of the second low acoustic impedance layers 322, 324, and 325 are lower than those of the second high acoustic impedance layers 321 and 323.

Similarly to the second acoustic impedance layer 32, the second acoustic impedance layer 33 includes the plurality of second high acoustic impedance layers 331 and 333 (two layers in the shown example) and the plurality of second low acoustic impedance layers 332, 334, and 335 (three layers in the shown example). In the second acoustic impedance layer 33, in the thickness direction (first direction D1) of the substrate 2, the second low acoustic impedance layer 335, the second high acoustic impedance layer 331, the second low acoustic impedance layer 332, the second high acoustic impedance layer 333, and the second low acoustic impedance layer 334 are laminated in this order from the side of the substrate 2.

The second high acoustic impedance layers 331 and 333 each have a relatively high acoustic impedance. The second low acoustic impedance layers 332, 334, and 335 each have a relatively low acoustic impedance. That is, the acoustic impedances of the second high acoustic impedance layers 331 and 333 are higher than those of the second low acoustic impedance layers 332, 334, and 335. In other words, the acoustic impedances of the second low acoustic impedance layers 332, 334, and 335 are lower than those of the second high acoustic impedance layers 331 and 333.

The insulating layer 34 is provided between the first acoustic impedance layer 31 and the second acoustic impedance layer 32 in a second direction D2 orthogonal or substantially orthogonal to the first direction D1. The insulating layer 34 is preferably made of an electrically insulating material, for example, $SiO_2$.

(2.3) Piezoelectric Layer

The piezoelectric layer 4 is provided on the intermediate layer 3. More specifically, the piezoelectric layer is provided on the intermediate layer 3 by a piezoelectric material, for example, $LiNbO_3$. The piezoelectric layer 4 is not limited to $LiNbO_3$, and may be another piezoelectric material, for example, $LiTaO_3$.

As shown in FIG. 2, a thickness of the piezoelectric layer 4 is smaller than a wave length of an acoustic wave which is determined by an electrode finger pitch P1 to be described later of the IDT electrode 5. The piezoelectric layer 4 preferably has the thickness of, for example, about 340 nm.

(2.4) IDT Electrode

As shown in FIG. 1 and FIG. 2, the IDT electrode 5 is provided on the piezoelectric layer 4. The IDT electrode 5 at least partially overlaps the first acoustic impedance layer 31 in a plan view from the first direction D1 which is the thickness direction of the substrate 2. Although not shown in FIG. 1, a reflector is provided adjacent to or in a vicinity of the IDT electrode 5. The IDT electrode 5 and the reflector are preferably made of metal, for example, Al. Note that the IDT electrode 5 and the reflector are not limited to Al, and may be made of other metal(s), for example, Cu, Pt, Au, Ti, Ni or the like, or alloy.

The IDT electrode 5 includes a first electrode 51 and a second electrode 52. The first electrode 51 includes a plurality of first electrode fingers 53 which are parallel or substantially parallel to one another, and a first busbar 54 which connects the plurality of first electrode fingers 53. The second electrode 52 includes a plurality of second electrode fingers 55 which are parallel or substantially parallel to one another, and a second busbar 56 which connects the plurality of second electrode fingers 55. The first electrode fingers 53 of the first electrode 51 and the second electrode fingers 55 of the second electrode 52 are interdigitated with each other. As described above, the thickness of the piezoelectric layer 4 is preferably equal to or smaller than about 1λ, for example, when the wave length of the acoustic wave determined by the electrode finger pitch P1 (a period of the first electrode finger 53 and the second electrode finger 55) of the IDT electrode 5 is defined as λ. The electrode finger pitch P1 refers to an interval between the first electrode finger 53 and the second electrode finger 55 which have different potentials from each other and are adjacent to each other in a direction (in a propagation direction of an acoustic wave) orthogonal or substantially orthogonal to a direction in which the first electrode finger 53 and the second electrode finger 55 extend (a longitudinal direction of the first electrode finger 53 and the second electrode finger 55). In other words, the electrode finger pitch P1 is, as shown in FIG. 2, a distance between corresponding sides to each other of the first electrode finger 53 and the second electrode finger 55 adjacent to each other (upper sides which are parallel or substantially parallel to center lines of the respective first electrode finger 53 and the second electrode finger 55 in FIG. 2).

(2.5) Electrode

The plurality of electrodes 61 and 62 are provided on the piezoelectric layer 4. More specifically, the plurality of electrodes 61 and 62 are provided on the piezoelectric layer 4 at positions different from a position of the IDT electrode 5. In addition, the electrode 61 at least partially overlaps the second acoustic impedance layer 32 in a plan view from the first direction D1 which is the thickness direction of the substrate 2. Similarly, the electrode 62 at least partially overlaps the second acoustic impedance layer 33 in a plan view from the first direction D1 which is the thickness direction of the substrate 2. The plurality of electrodes 61 and 62 are provided adjacent to each other on the piezoelectric layer 4. Each of the electrodes 61 and 62 has a rectangular or substantially rectangular plate shape, for example. The electrodes 61 and 62 are preferably made of metal, for example, Al. Also, the electrodes 61 and 62 are not limited to Al, and may be made of other metal(s), for example, Cu, Pt, Au, Ti, Ni or the like, or alloy. In addition, the electrodes 61 and 62 may be made of the same metal or alloy as the IDT electrode 5, or may be made of metal or alloy different from the IDT electrode 5. Further, the electrodes 61 and 62 may be made of the same metal or alloy, or may be made of different kinds of metal or alloy from each other.

(2.6) First Acoustic Impedance Layer and Second Acoustic Impedance Layer

As described above, the intermediate layer 3 includes the first acoustic impedance layer 31 and the plurality of second acoustic impedance layers 32 and 33 (two second acoustic impedance layers in the shown example).

As described above, the first acoustic impedance layer 31 has the laminated structure including the plurality of first high acoustic impedance layers 311 and 313 (two layers in the shown example) and the plurality of first low acoustic impedance layers 312, 314, and 315 (three layers in the shown example). The first high acoustic impedance layers 311 and 313 and the first low acoustic impedance layers 312, 314, and 315 are alternately arranged in the thickness direction (the first direction D1) of the substrate 2. The first acoustic impedance layer 31 faces the IDT electrode 5 in the thickness direction (first direction D1) of the substrate 2.

Each of the first high acoustic impedance layers 311 and 313 is defined by the first conductive layer having conductivity. For example, the first high acoustic impedance layers 311 and 313 may preferably be made of a metal such as W. Also, the first high acoustic impedance layers 311 and 313 are not limited to W, and may be made of other metal(s), for example, Pt.

Each of the first low acoustic impedance layers 312, 314, and 315 is made of an insulator, for example, $SiO_2$. Further, acoustic impedances of the first low acoustic impedance layers 312, 314, and 315 are lower than those of the first high acoustic impedance layers 311 and 313.

In the first acoustic impedance layer 31, as described above, the first high acoustic impedance layers 311 and 313 and the first low acoustic impedance layers 312, 314, and 315 are alternately laminated. Therefore, a plate wave propagated from the piezoelectric layer 4 is reflected at an interface between the first low acoustic impedance layer 314 and the first high acoustic impedance layer 313 and at an interface between the first low acoustic impedance layer 312 and the first high acoustic impedance layer 311.

As described above, the second acoustic impedance layer 32 has the laminated structure including the plurality of second high acoustic impedance layers 321 and 323 (two layers in the shown example) and the plurality of second low acoustic impedance layers 322, 324, and 325 (three layers in the shown example). The second high acoustic impedance layers 321 and 323 and the second low acoustic impedance layers 322, 324, and 325 are alternately arranged in the thickness direction (the first direction D1) of the substrate 2. The second acoustic impedance layer 32 is provided corresponding to the electrode 61. The second acoustic impedance layer 32 faces the electrode 61 in the thickness direction (first direction D1) of the substrate 2. Further, the second acoustic impedance layer 32 is arranged side by side with the first acoustic impedance layer 31 in the second direction D2 orthogonal or substantially orthogonal to the thickness direction of the substrate 2.

Each of the second high acoustic impedance layers 321 and 323 is defined by the second conductive layer having conductivity. For example, the second high acoustic impedance layers 321 and 323 may preferably be made of a metal such as W. The second high acoustic impedance layers 321 and 323 are not limited to W, and may be made of other metal(s), for example, Pt.

Each of the second low acoustic impedance layers 322, 324, and 325 is preferably made of an insulator, for example, $SiO_2$. Further, acoustic impedances of the second low acoustic impedance layers 322, 324, and 325 are lower than those of the second high acoustic impedance layers 321 and 323.

Similarly to the second acoustic impedance layer 32, the second acoustic impedance layer 33 has the laminated structure including the plurality of second high acoustic impedance layers 331 and 333 (two layers in the shown example) and the plurality of second low acoustic impedance layers 332, 334, and 335 (three layers in the shown example). The second high acoustic impedance layers 331 and 333 and the second low acoustic impedance layers 332, 334, and 335 are alternately arranged in the thickness direction (the first direction D1) of the substrate 2. The second acoustic impedance layer 33 is provided corresponding to the electrode 62. The second acoustic impedance layer 33 faces the electrode 62 in the thickness direction (first direction D1) of the substrate 2. Further, the second acoustic impedance layer 33 is arranged side by side with the first acoustic impedance layer in the second direction D2 orthogonal or substantially orthogonal to the thickness direction of the substrate 2.

Each of the second high acoustic impedance layers 331 and 333 is defined by the second conductive layer having conductivity. For example, the second high acoustic impedance layers 331 and 333 are preferably made of a metal such as W, similarly to the second high acoustic impedance layers 321 and 323. The second high acoustic impedance layers 331 and 333 are not limited to W, and may be made of other metal(s), for example, Pt.

Each of the second low acoustic impedance layers 332, 334, and 335 is preferably made of an insulator, for example, $SiO_2$, similarly to the second low acoustic impedance layers 322, 324, and 325. Also, in the second acoustic impedance layer 33, similarly to the second acoustic impedance layer 32, acoustic impedances of the second acoustic impedance layers 332, 334, and 335 are lower than those of the second high acoustic impedance layers 331 and 333.

As described above, the second acoustic impedance layer 32 faces the electrode 61 with the piezoelectric layer 4 interposed therebetween in the thickness direction (first direction D1) of the substrate 2. As a result, the acoustic wave device 1 is provided with the capacitor 71 for which the second high acoustic impedance layer 323 and the electrode 61 define and function as a pair of electrodes, which is between the second high acoustic impedance layer 323 of the second acoustic impedance layer 32 and the electrode 61. That is, the capacitor 71 is defined by the second high acoustic impedance layer 323 of the second acoustic impedance layer 32 and the electrode 61.

Similarly, the second acoustic impedance layer 33 faces the electrode 62 with the piezoelectric layer 4 interposed therebetween in the thickness direction (first direction D1) of the substrate 2. As a result, the capacitor 72 for which the second high acoustic impedance layer 333 and the electrode 62 define and function as a pair of electrodes is between the second high acoustic impedance layer 333 of the second acoustic impedance layer 33 and the electrode 62. That is, the capacitor 72 is defined by the second high acoustic impedance layer 333 of the second acoustic impedance layer 33 and the electrode 62.

The second high acoustic impedance layer 323 of the second acoustic impedance layer 32 and the second high acoustic impedance layer 333 of the second acoustic impedance layer 33 are electrically connected to each other. In addition, the plurality of second high acoustic impedance layers 323 and 333 are preferably made of the same or substantially the same material. That is, the second high acoustic impedance layer 323 and the second high acoustic impedance layer 333 are integrated. Thus, in the acoustic wave device 1 according to the first preferred embodiment, the plurality of capacitors 71 and 72 (two capacitors in the shown example) are electrically connected in series between the electrode 61 and the electrode 62. Note that the second high acoustic impedance layer 321 of the second acoustic impedance layer 32 and the second high acoustic impedance layer 331 of the second acoustic impedance layer 33 are also electrically connected to each other. Additionally, the plurality of second high acoustic impedance layers 321 and 331 are formed of the same or substantially the same material.

Here, the first high acoustic impedance layer 313 is electrically insulated from the second high acoustic impedance layer 323 and the second high acoustic impedance layer 333 with the insulating layer 34 located therebetween. Similarly, the first high acoustic impedance layer 311 is electrically insulated from the second high acoustic impedance layer 321 and the second high acoustic impedance layer 331 with the insulating layer 34 located therebetween.

On the other hand, the first high acoustic impedance layer 313 of the first acoustic impedance layer 31 is made of the same or substantially the same material as the second high acoustic impedance layers 323 and 333 of the second acoustic impedance layers 32 and 33. Similarly, the first high acoustic impedance layer 311 of the first acoustic impedance layer 31 is made of the same or substantially the same material as the second high acoustic impedance layers 321 and 331 of the second acoustic impedance layers 32 and 33.

(3) Method for Manufacturing Acoustic Wave Device

Next, a manufacturing method for the acoustic wave device 1 according to the first preferred embodiment will be described with reference to FIGS. 4A to 4G and FIGS. 5A to 5D. In the method for manufacturing the acoustic wave device 1, a first process to an eleventh process are performed in sequence.

Figure 4A:
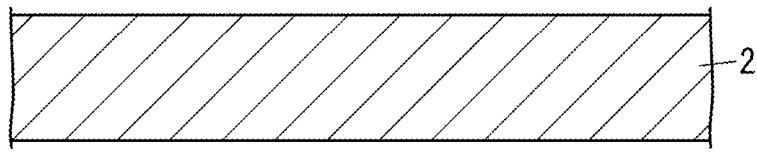
FIGS. 4A to 4G are a process diagram showing a process of manufacturing the acoustic wave device of FIG. 1.

In the first process, as shown in FIG. 4A, the substrate 2 is prepared. The substrate 2 is preferably, for example, an Si substrate.

In the second process to the seventh process, the first acoustic impedance layer 31 having the laminated structure including the plurality of first high acoustic impedance layers 311 and 313 and the plurality of first low acoustic impedance layers 312, 314, and 315 is formed on the substrate 2. Similarly, in the second process to the seventh process, the second acoustic impedance layer 32 having the laminated structure including the plurality of second high acoustic impedance layers 321 and 323 and the plurality of second low acoustic impedance layers 322, 324, and 325 is formed on the substrate 2. Further, in the second process to the seventh process, the second acoustic impedance layer 33 having the laminated structure including the plurality of second high acoustic impedance layers 331 and 333 and the plurality of second low acoustic impedance layers 332, 334, and 335 is formed on the substrate 2.

Figure 4B:
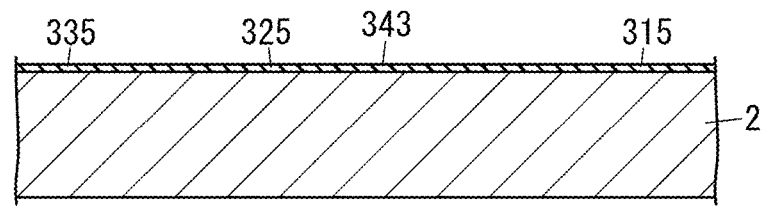

In the second process, as shown in FIG. 4B, the first low acoustic impedance layer 315, the second low acoustic impedance layers 325 and 335, and a portion 343 of the insulating layer 34 are formed. In other words, in the second process, an insulating film is formed on the substrate 2. A material of the insulating film is preferably, for example, $SiO_2$. In the second process, the insulating film is formed by a CVD method. Thus, the first low acoustic impedance layer 315 and the second low acoustic impedance layers 325 and 335 can be formed at the same time. In other words, in the second process, the first low acoustic impedance layer 315 and the second low acoustic impedance layers 325 and 335 are formed simultaneously in one process by using the same or substantially the same material.

Figure 4C:
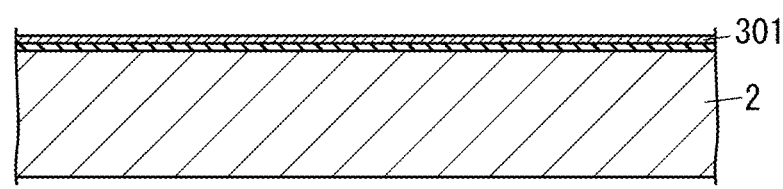

In the third process, as shown in FIG. 4C, a conductive film 301 for the first high acoustic impedance layer 311 and the second high acoustic impedance layers 321 and 331 is formed. In more detail, in the third process, the conductive film 301 is formed on the insulating film formed in the second process by a method that forms a thin film, for example, CVD, sputtering, vapor deposition or the like. A material of the conductive film 301 is preferably W, for example.

Figure 4D:
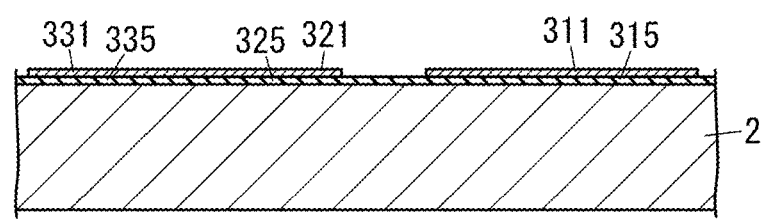

In the fourth process, as shown in FIG. 4D, the first high acoustic impedance layer 311 and the second high acoustic impedance layers 321 and 331 are formed. More specifically, in the fourth process, a portion of the conductive film is removed by etching, so that the first high acoustic impedance layer 311 and the second high acoustic impedance layers 321 and 331 are electrically insulated from each other.

Figure 4E:
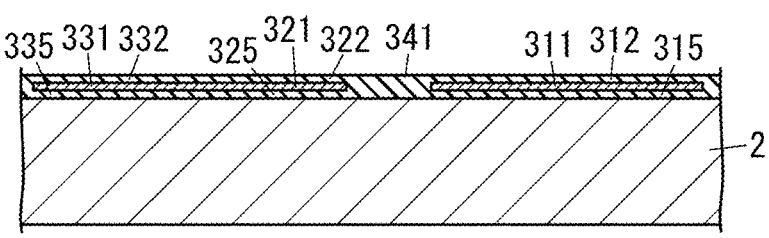

In the fifth process, as shown in FIG. 4E, the first low acoustic impedance layer 312, the second low acoustic impedance layers 322 and 332, and a portion 341 of the insulating layer 34 are formed. More specifically, in the fourth process, an insulating film covers the first high acoustic impedance layer 311 and the second high acoustic impedance layers 321 and 331. A material of the insulating film is preferably, for example, $SiO_2$. In the fifth process, an insulating film is formed by the CVD method. Thus, the first low acoustic impedance layer 312 and the second low acoustic impedance layers 322 and 332 can be formed at the same time. In other words, in the fifth process, the first low acoustic impedance layer 312 and the second low acoustic impedance layers 322 and 332 are formed simultaneously in one process by using the same or substantially the same material.

Figure 4F:
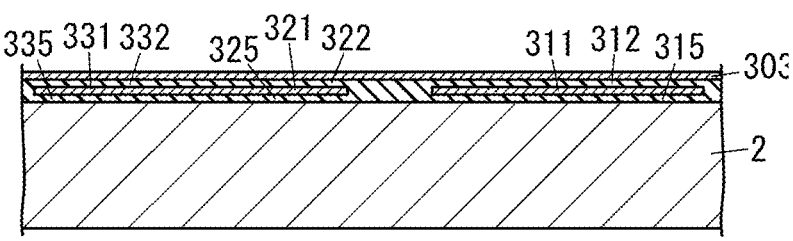

In the sixth process, as shown in FIG. 4F, a conductive film 303 for the first high acoustic impedance layer 313 and the second high acoustic impedance layers 323 and 333 is formed. More specifically, in the sixth process, the conductive film 303 is formed on the insulating film. A material of the conductive film 303 is preferably W, for example. In the sixth process, the conductive film 303 is formed on the insulating film by a method that forms a thin film, for example, CVD, sputtering, vapor deposition or the like.

Figure 4G:
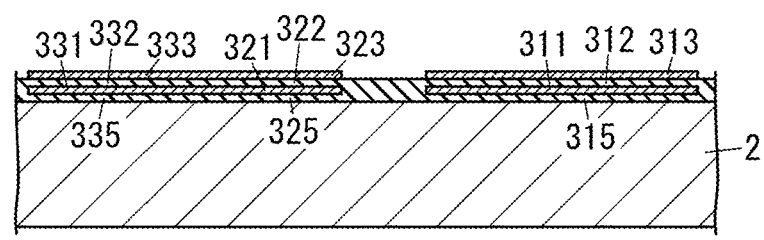

In the seventh process, as shown in FIG. 4G, the first high acoustic impedance layer 313 and the second high acoustic impedance layers 323 and 333 are formed. More specifically, in the seventh process, a portion of the conductive film 303 is removed by etching, so that the first high acoustic impedance layer 313 and the second high acoustic impedance layers 323 and 333 are electrically insulated from each other. Here, the portion of the conductive film 303 which overlaps the portion where the conductive film 301 is removed, is removed by etching in a plan view from the thickness direction of the substrate 2. Thus, the first high acoustic impedance layer 313 is formed on the laminated structure of the first high acoustic impedance layer 311 and the first low acoustic impedance layer 312. Further, the second high acoustic impedance layers 323 and 333 are formed on the laminated structure of the second high acoustic impedance layers 321 and 331 and the second low acoustic impedance layers 322 and 332.

Figure 5A:
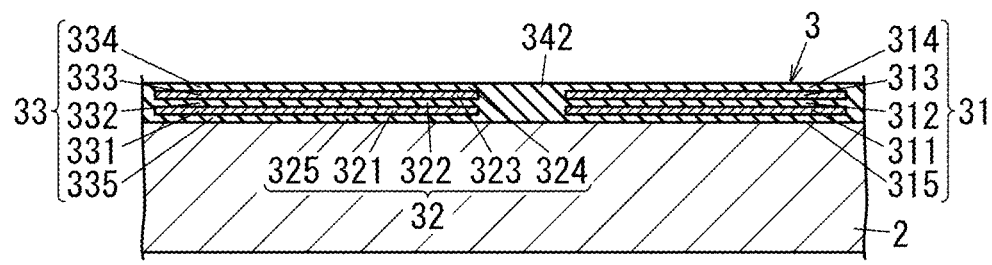
FIGS. 5A to 5D are a process diagram showing a process of manufacturing the acoustic wave device of FIG. 1.

In the eighth process, as shown in FIG. 5A, the first low acoustic impedance layer 314, the second low acoustic impedance layers 324 and 334, and a portion 342 of the insulating layer 34 are formed. More specifically, in the eighth process, an insulating film is formed to covers the first high acoustic impedance layer 313, the second high acoustic impedance layers 323 and 333 and an exposed portion which is the portion 341 of the insulating layer 34. A material of the insulating film in the eighth process is preferably $SiO_2$, for example. The insulating film in the eighth process preferably includes, for example, the same or substantially the same material as the insulating film in the fifth process. However, the insulating film in the eighth process is not limited to being formed of the same material as the insulating film in the fifth process, and may be formed of a material different from the insulating film in the fifth process. In the eighth process, the first low acoustic impedance layer 314 and the second low acoustic impedance layers 324 and 334 are formed simultaneously in one process by using the same or substantially the same material.

Figure 5B:
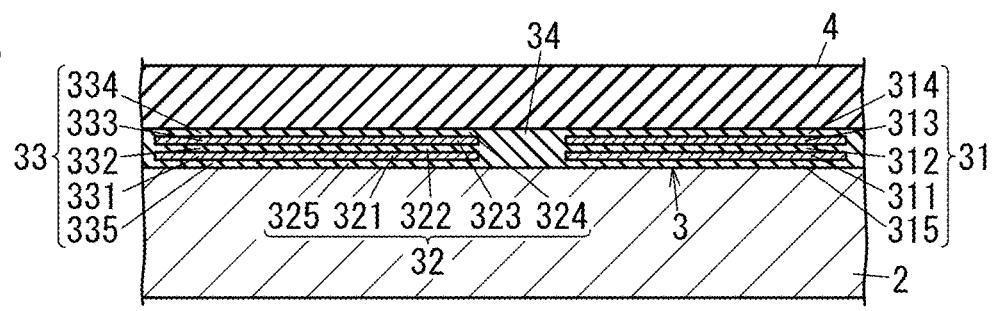

In the ninth process, as shown in FIG. 5B, the piezoelectric layer 4 is formed on the intermediate layer 3.

In the tenth process and the eleventh process, the IDT electrode 5 and the plurality of electrodes 61 and 62 are formed on the piezoelectric layer 4 at positions different from each other.

Figure 5C:
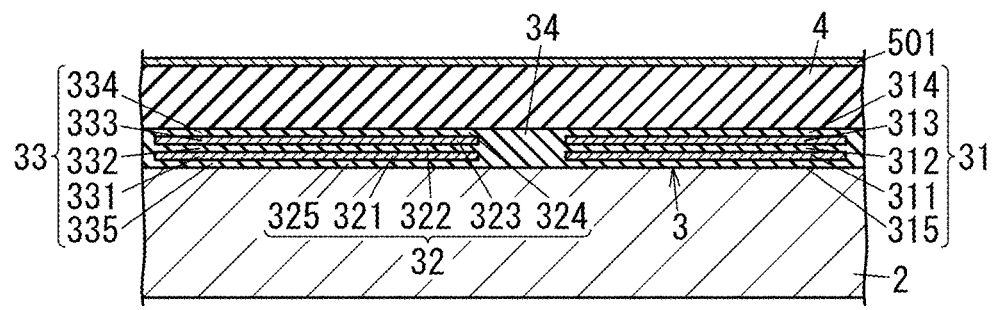

In the tenth process, as shown in FIG. 5C, a conductive film 501 which becomes an origin of the IDT electrode 5, the plurality of electrodes 61 and 62, and a plurality of wirings 60 is formed on the piezoelectric layer 4. More specifically, in the tenth process, the conductive film 501 is formed on the piezoelectric layer 4 by a method that forms a thin film, for example, sputtering, vapor deposition or the like. The conductive film 501 is preferably made of, for example, Al.

Figure 5D:
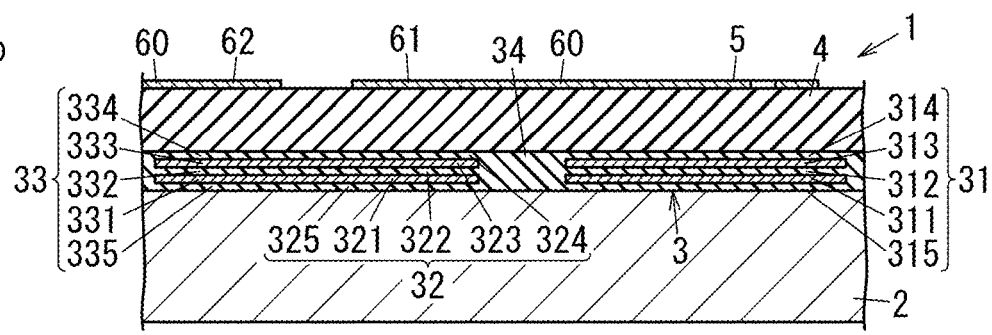

In the eleventh process, as shown in FIG. 5D, the IDT electrode 5, the plurality of electrodes 61 and 62, and the plurality of wirings 60 are formed on the piezoelectric layer 4 by photolithography and etching. More specifically, in the eleventh process, the IDT electrode 5 is formed at a position facing the laminated structure of the first high acoustic impedance layers 311 and 313 and the first low acoustic impedance layers 312, 314, and 315 in a plan view from the thickness direction (first direction D1) of the substrate 2. Moreover, the electrode 61 is formed at a position facing the laminated structure of the second high acoustic impedance layers 321 and 323 and the second low acoustic impedance layers 322, 324, and 325 in a plan view from the thickness direction of the substrate 2. Similarly, in a plan view from the thickness direction of the substrate 2, the electrode 62 is formed at a position facing the laminated structure of the second high acoustic impedance layers 331 and 333 and the second low acoustic impedance layers 332, 334, and 335. Also, in the eleventh process, the IDT electrode 5, the plurality of electrodes 61 and 62, and the plurality of wirings 60 are not limited to being formed by photolithography and etching on the piezoelectric layer 4, and may be formed by, for example, lift-off. When the IDT electrode 5, the plurality of electrodes 61 and 62, and the plurality of wirings 60 are formed by the lift-off, the tenth process can be omitted.

(4) Operation of Resonator

The acoustic wave device 1 according to the first preferred embodiment includes an acoustic wave resonator and a capacitor. A portion of the acoustic wave device 1 according to the first preferred embodiment operates as the acoustic wave resonator. As described above, since the thickness of the piezoelectric layer 4 is smaller than the wave length of the acoustic wave determined by the electrode finger pitch P1 of the IDT electrode 5, when an alternating electric field is applied to the IDT electrode 5, the plate wave which is the acoustic wave is efficiently excited, and propagates through the piezoelectric layer 4. In the acoustic wave device 1, since the first acoustic impedance layer 31 is provided in the intermediate layer 3, the plate wave leaking to a side of the intermediate layer 3 is reflected at the interface between the first high acoustic impedance layer 313 and the first low acoustic impedance layer 314 and at the interface between the first high acoustic impedance layer 311 and the first low acoustic impedance layer 312. Therefore, the plate wave with a high energy intensity can propagate through the piezoelectric layer 4.

(5) Ladder Filter

The acoustic wave device according to the first preferred embodiment may preferably be, for example, the ladder filter 9 as shown in FIG. 3. The ladder filter 9 according to the first preferred embodiment will be described below.

The ladder filter 9 includes a series arm circuit 97 and a plurality of parallel arm circuits 981 and 982 (two parallel arm circuits in the shown example). The series arm circuit 97 is electrically connected in series on a first path (a series arm) electrically connecting an input terminal 961 and an output terminal 962. Each of the plurality of parallel arm circuits 981 and 982 is provided on a second path electrically connecting each of nodes on the first path and the ground.

The series arm circuit 97 includes a plurality of series arm resonators 91 to 93 (three series arm resonators in the shown example). The parallel arm circuit 981 includes a parallel arm resonator 94. One end of the parallel arm resonator 94 is electrically connected to a connection point (a node on the first path) between the series arm resonator 91 and the series arm resonator 92, and the other end of the parallel arm resonator 94 is electrically connected to the ground. The parallel arm circuit 982 includes a parallel arm resonator 95. One end of the parallel arm resonator 95 is electrically connected to a connection point (a node on the first path) between the series arm resonator 92 and the series arm resonator 93, and the other end of the parallel arm resonator 95 is electrically connected to the ground.

In the ladder filter 9 as described above, for example, a configuration of the acoustic wave device 1 (see FIG. 1) is included in the series arm resonator 93 which is connected closest to the output terminal 962 on the first path described above among the plurality of series arm resonators 91 to 93. In other words, a resonator using the piezoelectric layer 4 and the IDT electrode 5 of the acoustic wave device 1 is the series arm resonator 93. Also, the series arm resonator 93 connected closest to the output terminal 962 is a resonator which is electrically connected closest to the output terminal 962 among the plurality of series arm resonators 91 to 93.

As described above, when the acoustic wave device 1 is included in the series arm resonator 93, the plurality of capacitors 71 and 72 are electrically connected between the series arm resonator 93 and the output terminal 962. The plurality of capacitors 71 and 72 are electrically connected in series. In other words, the capacitors 71 and 72 are provided, on the first path described above, between the output terminal 962 and the series arm resonator 93 which is electrically connected closest to the output terminal 962 on the first path. An inductor 73 is electrically connected between the capacitor 72 and the output terminal 962, so that a matching circuit, a surge countermeasure circuit, or a filter circuit can be configured. Note that the inductor 73 is not limited to being electrically connected between the capacitor 72 and the output terminal 962, but may be electrically connected between the capacitor 71 and the series arm resonator 93.

As described above, when the matching circuit, the surge countermeasure circuit, or the filter circuit is provided in the ladder filter 9, a circuit with a relatively small size and a relatively low loss is preferably included, for example. In the example shown in FIG. 3, elements of the circuit may be provided between the series arm resonator 93 and the output terminal 962. Since these elements can be produced in the thickness direction (first direction D1) of the substrate 2, for example, in a case where an interdigitated array electrode is used, it is possible to produce the circuit with the small size and the low loss. That is, since the capacitors 71 and 72 can be produced in the thickness direction of the substrate 2, an element with a large capacitance and a low resistance can be produced.

Further, since the capacitors 71 and 72 can be produced in the substrate 2, miniaturization and reduction in the number of additional elements (for example, discrete elements) can be achieved.

Further, since the capacitors 71 and 72 can be produced in the same process as the resonators, cost can be reduced as compared with a case where the resonators and the capacitors are produced in different processes.

(6) Advantageous Effects

As described above, in the acoustic wave device 1 according to the first preferred embodiment, the first high acoustic impedance layers 311 and 313 of the first acoustic impedance layer 31 facing the IDT electrode 5 are electrically insulated from the second high acoustic impedance layers 321, 323, 331, and 333 of the second acoustic impedance layers 32 and 33 facing the electrodes 61 and 62. Thus, as compared with a case where the capacitors are discrete elements or the capacitors are provided on a wiring substrate, it is possible to reduce an overall size of the acoustic wave device 1 while significantly reducing or preventing deterioration in characteristics.

In the acoustic wave device 1 according to the first preferred embodiment, the second acoustic impedance layers 32 and 33 overlap at least a portion of the electrode 61 and at least a portion of the electrode 62, respectively, in the thickness direction (first direction D1) of the substrate 2, and the plurality of second high acoustic impedance layers 321, 323, 331, and 333 of the second acoustic impedance layers 32 and 33 include the second conductive layers. Thus, the second conductive layers described above can be used as the other electrodes that are different from the electrodes 61 and 62 in the capacitors 71 and 72. As a result, the capacitors 71 and 72 can be miniaturized in the thickness direction (first direction D1) of the substrate 2, as compared with a case where the other electrodes of the capacitors are provided separately from the second conductive layers.

In the acoustic wave device 1 according to the first preferred embodiment, the plurality of second high acoustic impedance layers 323 and 333 in the plurality of second acoustic impedance layers 32 and 33 corresponding to the plurality of electrodes 61 and 62 are electrically connected to each other. Thus, the plurality of capacitors 71 and 72 can be easily provided.

In the acoustic wave device 1 according to the first preferred embodiment, the plurality of second high acoustic impedance layers 323 and 333 are made of the same or substantially the same material. Similarly, the plurality of second high acoustic impedance layers 321 and 331 are also made of the same or substantially the same material. Thus, the plurality of second acoustic impedance layers 32 and 33 can be easily formed.

In the acoustic wave device 1 according to the first preferred embodiment, the first high acoustic impedance layer 313 of the first acoustic impedance layer 31 and the second high acoustic impedance layers 323 and 333 of the second acoustic impedance layers 32 and 33 are made of the same or substantially the same material. Similarly, the first high acoustic impedance layer 311 of the first acoustic impedance layer 31 and the second high acoustic impedance layers 321 and 331 of the second acoustic impedance layers 32 and 33 are made of the same or substantially the same material. Thus, the first acoustic impedance layer 31 and the second acoustic impedance layers 32 and 33 can be easily formed.

In the method for manufacturing the acoustic wave device 1 according to the first preferred embodiment, in the forming of the high acoustic impedance layers (second high acoustic impedance layers 321, 323, 331, and 333), the second conductive layers are formed at positions facing the electrodes 61 and 62 in the thickness direction (first direction D1) of the substrate 2. Thus, since the capacitors 71 and 72 can be manufactured in the same process as the resonators, the manufacturing process of the acoustic wave device 1 can be simplified as compared with a case where the resonators and the capacitors are separately manufactured.

(7) Modification

A modification of the first preferred embodiment will be described below.

Although the acoustic wave device 1 according to the first preferred embodiment includes two electrodes 61 and 62, the acoustic wave device 1 may include only one electrode or three or more electrodes as a modification of the first preferred embodiment. In short, the acoustic wave device 1 may include at least one electrode.

In the first preferred embodiment, the acoustic wave device 1 includes two second acoustic impedance layers 32 and 33, but as a modification of the first preferred embodiment, the acoustic wave device 1 may include only one second acoustic impedance layer, or may include three or more second acoustic impedance layers. In short, the acoustic wave device 1 may include at least one second acoustic impedance layer.

A lamination number of the first acoustic impedance layers 31 (the total number of the first high acoustic impedance layers and the first low acoustic impedance layers) is not limited to five layers, and may be three layers or seven or more layers. In addition, in the first acoustic impedance layer 31, the number of the first high acoustic impedance layers and the number of the first low acoustic impedance layers may be the same. That is, the lamination number of the first acoustic impedance layers 31 may be an even number of layers, for example, two layers, four layers, six layers or the like.

A lamination number of each of the second acoustic impedance layers 32 and 33 (the total number of the second high acoustic impedance layers and the second low acoustic impedance layers) is also the same as that of the first acoustic impedance layer 31, and is not limited to five layers, and may be three layers or seven layers or more. In addition, in each of the second acoustic impedance layers 32 and 33, the number of the second high acoustic impedance layers and the number of the second low acoustic impedance layers may be the same. That is, the lamination number of each of the second acoustic impedance layers 32 and 33 may be an even number of layers, for example, two layers, four layers, six layers or the like.

In the first preferred embodiment, all of the plurality of first high acoustic impedance layers 311 and 313 in the first acoustic impedance layer 31 are the first conductive layers having conductivity, but only one of the plurality of first high acoustic impedance layers 311 and 313 may be the first conductive layer. In short, the plurality of first high acoustic impedance layers 311 and 313 may include the first conductive layer of at least one layer.

In the first preferred embodiment, all of the plurality of second high acoustic impedance layers 321 and 323 in the second acoustic impedance layer 32 are the second conductive layers having conductivity, but only one of the plurality of second high acoustic impedance layers 321 and 323 may be the second conductive layer. In short, the plurality of second high acoustic impedance layers 321 and 323 may include the second conductive layer of at least one layer. Likewise, all of the plurality of second high acoustic impedance layers 331 and 333 in the second acoustic impedance layer 33 are the second conductive layers having conductivity, but only one of the plurality of second high acoustic impedance layers 331 and 333 may be the second conductive layer. In short, the plurality of second high acoustic impedance layers 331 and 333 may include at least one second conductive layer.

The plurality of first high acoustic impedance layers 311 and 313 in the first acoustic impedance layer 31 are not limited to being made of the same material, and may be made of different materials. The plurality of second high acoustic impedance layers 321 and 323 in the second acoustic impedance layer 32 are also not limited to being made of the same material, and may be made of different materials. The plurality of second high acoustic impedance layers 331 and 333 in the second acoustic impedance layer 33 are also not limited to being made of the same material, and may be made of different materials.

The plurality of first low acoustic impedance layers 312, 314, and 315 in the first acoustic impedance layer 31 are not limited to being made of the same material, and may be made of different materials. The plurality of second low acoustic impedance layers 322, 324, and 325 in the second acoustic impedance layer 32 are also not limited to being made of the same material, and may be made of different materials. The plurality of second low acoustic impedance layers 332, 334, and 335 in the second acoustic impedance layer 33 are also not limited to being made of the same material, and may be made of different materials.

The first acoustic impedance layer 31 is not limited to an example in which the first high acoustic impedance layers 311 and 313 are the first conductive layers, and the first low acoustic impedance layers 312, 314, and 315 may be the first conductive layers. Similarly, the second acoustic impedance layers 32 and 33 are also not limited to an example in which the second high acoustic impedance layers 321, 323, 331, and 333 are the second conductive layers, and the second low acoustic impedance layers 322, 324, 325, 332, 334, and 335 may be the second conductive layers. In any case, a capacitor in which the second conductive layer and the electrode are formed as a pair of electrodes may be formed, and the first conductive layer may be electrically insulated from the second conductive layer.

Although the resonator using the piezoelectric layer 4 and the IDT electrode 5 of the acoustic wave device 1 is the series arm resonator 93 in the example shown in FIG. 3, the resonator may be the series arm resonator 91 or the series arm resonator 92, or may be the parallel arm resonator 94 or the parallel arm resonator 95. In short, at least one resonator among the plurality of series arm resonators 91 to 93 and the plurality of parallel arm resonators 94 and 95 may be the resonator using the piezoelectric layer 4 and the IDT electrode 5 of the acoustic wave device 1.

In the example shown in FIG. 3, the capacitors 71 and 72 are provided on an output side (between the series arm resonator 93 and the output terminal 962) of the ladder filter 9, and the second conductive films configuring the capacitors 71 and 72 are electrically connected to each other. However, instead of the output side of the ladder filter 9, at least two capacitors may be provided on an input side (for example, between the input terminal 961 and the series arm resonator 91) of the ladder filter 9. In this case, at least two second conductive films configuring at least two capacitors are electrically connected to each other. Alternatively, at least two capacitors may be provided on each of the input side and the output side of the ladder filter 9. In this case, the electrode of the capacitor provided on the input side of the ladder filter 9 and the electrode of the capacitor provided on the output side of the ladder filter 9 are not electrically connected to each other.

In the first preferred embodiment, although the first acoustic impedance layer 31 and the second acoustic impedance layers 32 and 33 are provided on the substrate 2, the first acoustic impedance layer 31 and the second acoustic impedance layers 32 and 33 may be provided on the piezoelectric layer 4 as a modification of the first preferred embodiment. In short, the first acoustic impedance layer 31 and the second acoustic impedance layers 32 and 33 may be provided between the substrate 2 and the piezoelectric layer 4.

In this modification, the first acoustic impedance layer 31 and the second acoustic impedance layers 32 and 33 are provided on a piezoelectric substrate which defines the piezoelectric layer 4, and then the substrate 2 is laminated. The first acoustic impedance layer 31 and the second acoustic impedance layers 32 and are sandwiched between the piezoelectric layer 4 and the substrate 2. Even in this modification, the first acoustic impedance layer 31 that overlaps at least a portion of the IDT electrode 5 and the second acoustic impedance layers 32 and 33 that include conductive layers (the second high acoustic impedance layers 323 and 333) that define the capacitors 71 and 72 by using the electrodes 61 and 62 can be simultaneously provided between the substrate 2 and the piezoelectric layer 4.

Second Preferred Embodiment

Figure 6:
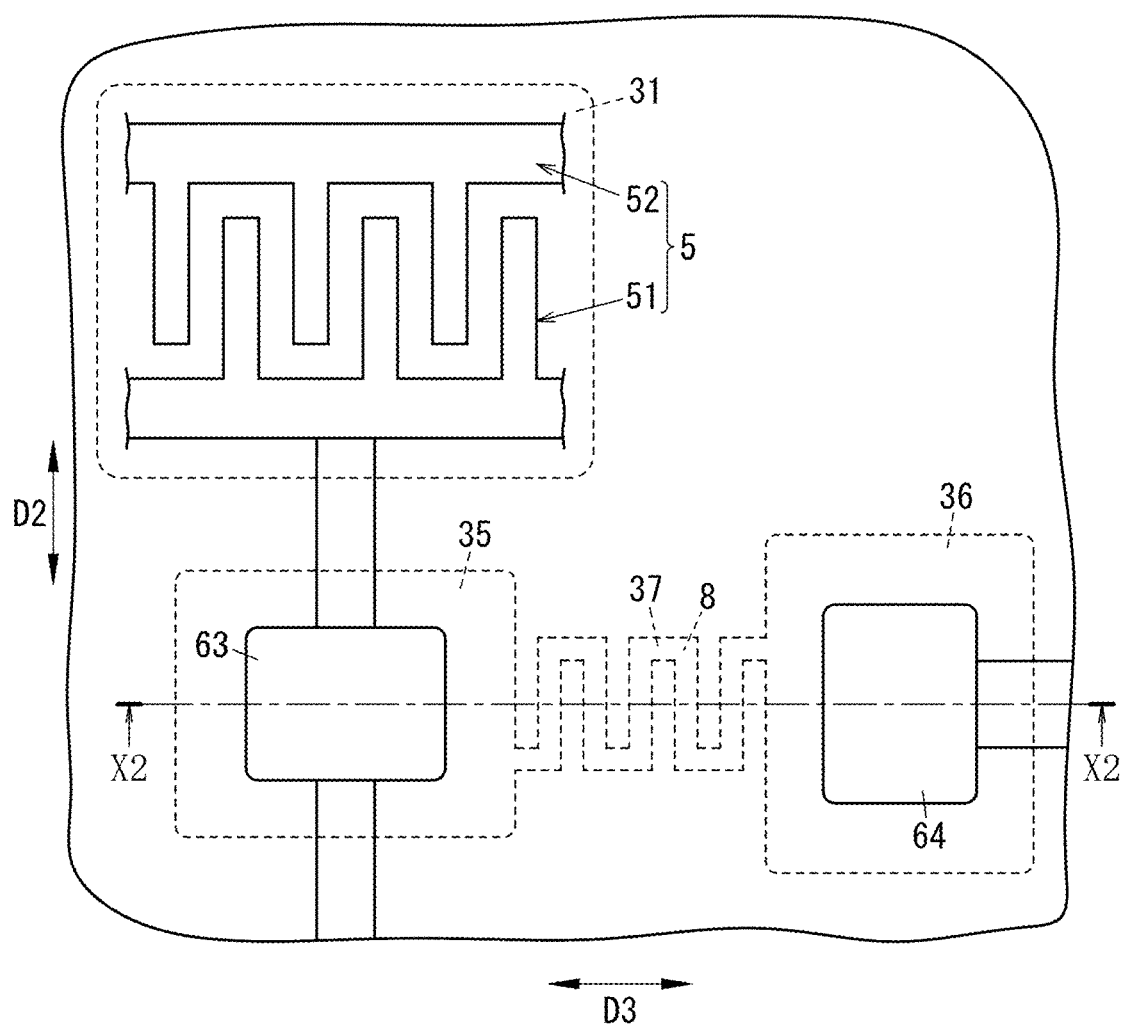
FIG. 6 is a front view of an acoustic wave device according to a second preferred embodiment of the present invention.
Figure 7:
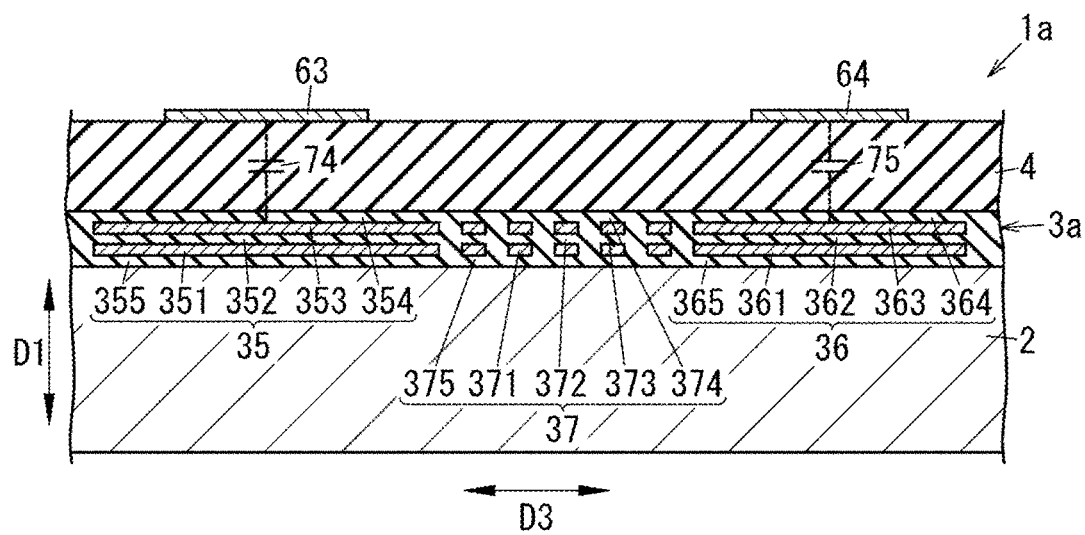
FIG. 7 is a cross-sectional view of the acoustic wave device of FIG. 6.

As shown in FIG. 6, an acoustic wave device 1a according to a second preferred embodiment of the present invention is different from the acoustic wave device 1 according to the first preferred embodiment (see FIG. 2) in that the acoustic wave device 1a includes an inductor 8 (a third acoustic impedance layer 37) together with the IDT electrode 5. The same or similar elements as those in the acoustic wave device 1 according to the first preferred embodiment are denoted by the same reference signs, and description thereof will be omitted. In addition, FIG. 7 is a cross-sectional view taken along a line X2-X2 in FIG. 6.

As shown in FIG. 6 and FIG. 7, the acoustic wave device 1a according to the second preferred embodiment includes the substrate 2, an intermediate layer 3a, the piezoelectric layer 4, the IDT electrode 5, and a plurality of electrodes 63 and 64 (two electrodes in the shown example). Note that since the substrate 2, the piezoelectric layer 4, and the IDT electrode 5 according to the second preferred embodiment are the same or similar elements to the substrate 2, the piezoelectric layer 4, and the IDT electrode 5 (see FIG. 1 and FIG. 2) according to the first preferred embodiment, the same reference signs are used for the same or similar elements, and description thereof will be omitted.

The plurality of electrodes 63 and 64 are provided on the piezoelectric layer 4. More specifically, the plurality of electrodes 63 and 64 are provided on the piezoelectric layer 4 at positions different from a position of the IDT electrode 5. The plurality of electrodes 63 and 64 are provided adjacent to each other on the piezoelectric layer 4. Each of the electrodes 63 and 64 has a rectangular or substantially rectangular plate shape, for example. The electrodes 63 and 64 are preferably made of a metal, for example, Al. Also, the electrodes 63 and 64 are not limited to Al, and may be made of other metal(s), for example, Cu, Pt, Au, Ti, Ni or the like, or alloy. In addition, the electrodes 63 and 64 may be made of the same metal or alloy as the IDT electrode 5, or may be made of metal or alloy different from the IDT electrode 5. Further, the electrodes 63 and 64 may be made of the same metal or alloy, or may include different kinds of metal or alloy from each other.

The intermediate layer 3a includes the first acoustic impedance layer 31 (see FIG. 1), a plurality of second acoustic impedance layers 35 and 36 (two second acoustic impedance layers in the shown example), and the third acoustic impedance layer 37. The intermediate layer 3a is provided on the substrate 2. Note that since the first acoustic impedance layer 31 according to the second preferred embodiment has the same or similar features and operations as the first acoustic impedance layer 31 according to the first preferred embodiment, the description thereof will be omitted.

The second acoustic impedance layer 35 has a laminated structure including a plurality of second high acoustic impedance layers 351 and 353 (two layers in the shown example) and a plurality of second low acoustic impedance layers 352, 354, and 355 (three layers in the shown example). The second acoustic impedance layer 35 faces the electrode 63 in a thickness direction (first direction D1) of the substrate 2.

Each of the second high acoustic impedance layers 351 and 353 defines the second conductive layer having conductivity. For example, the second high acoustic impedance layers 351 and 353 may preferably be made of a metal, for example, such as W. Also, the second high acoustic impedance layers 351 and 353 are not limited to W, and may be made of other metal(s), for example, Pt.

Each of the second low acoustic impedance layers 352, 354, and 355 is preferably made of an insulator, for example, SiO$_2$. Further, acoustic impedances of the second low acoustic impedance layers 352, 354, and 355 are lower than those of the second high acoustic impedance layers 351 and 353.

Similarly to the second acoustic impedance layer 35, the second acoustic impedance layer 36 has a laminated structure including a plurality of second high acoustic impedance layers 361 and 363 (two layers in the shown example) and a plurality of second low acoustic impedance layers 362, 364, and 365 (three layers in the shown example). The second acoustic impedance layer 36 faces the electrode 64 in the thickness direction (first direction D1) of the substrate 2.

Each of the second high acoustic impedance layers 361 and 363 defines the second conductive layer having conductivity. For example, the second high acoustic impedance layers 361 and 363 are preferably made of a metal such as W, similarly to the second high acoustic impedance layers 351 and 353. Note that the second high acoustic impedance layers 361 and 363 are not limited to W, and may be made of other metal(s), for example, Pt.

Each of the second low acoustic impedance layers 362, 364, and 365 is preferably made of an insulator, for example, SiO2, similarly to the second low acoustic impedance layers 352, 354, and 355. Also in the second acoustic impedance layer 36, similarly to the second acoustic impedance layer 35, acoustic impedances of the second low acoustic impedance layers 362, 364, and 365 are higher than those of the second high acoustic impedance layers 361 and 363.

As described above, the second acoustic impedance layer 35 faces the electrode 63 with the piezoelectric layer 4 interposed therebetween in the thickness direction (first direction D1) of the substrate 2. As a result, a capacitor 74 for which the second high acoustic impedance layer 353 and the electrode 63 define and function as a pair of electrodes is provided between the second high acoustic impedance layer 353 of the second acoustic impedance layer 35 and the electrode 63 in the acoustic wave device 1a.

Similarly, the second acoustic impedance layer 36 faces the electrode 64 with the piezoelectric layer 4 interposed therebetween in the thickness direction (first direction D1) of the substrate 2. As a result, a capacitor 75 for which the second high acoustic impedance layer 363 and the electrode 64 define and function as a pair of electrodes is formed between the second high acoustic impedance layer 363 of the second acoustic impedance layer 36 and the electrode 64.

The third acoustic impedance layer 37 is provided between the second acoustic impedance layer 35 and the second acoustic impedance layer 36 in a third direction D3 orthogonal or substantially orthogonal to the thickness direction (first direction D1) of the substrate 2 and the second direction D2 in which the electrode 63 and the IDT electrode 5 are arranged side by side. The third acoustic impedance layer 37 has a laminated structure including a plurality of third high acoustic impedance layers 371 and 373 (two layers in the shown example) and a plurality of third low acoustic impedance layers 372, 374, and 375 (three layers in the shown example).

Each of the third high acoustic impedance layers 371 and 373 defines a third conductive layer having conductivity. For example, the third high acoustic impedance layers 371 and 373 may preferably be made of metal such as W. Each of the third high acoustic impedance layers 371 and 373 has a meander shape in a plan view from the thickness direction (first direction D1) of the substrate 2. The third high acoustic impedance layers 371 and 373 overlap each other in the first direction D1.

From the above, in the acoustic wave device 1a according to the second preferred embodiment, the third high acoustic impedance layer 373 defining the inductor 8 is provided between the second high acoustic impedance layer 353 of the second acoustic impedance layer 35 and the second high acoustic impedance layer 363 of the second acoustic impedance layer 36.

The third high acoustic impedance layer 373 of the third acoustic impedance layer 37 is electrically connected to the second high acoustic impedance layers 353 and 363 of the second acoustic impedance layers 35 and 36. Additionally, the third high acoustic impedance layer 373 is made of the same or substantially the same material as the second high acoustic impedance layers 353 and 363. That is, the third high acoustic impedance layer 373 and the second high acoustic impedance layers 353 and 363 are integrated. Accordingly, in the acoustic wave device 1a according to the second preferred embodiment, the plurality of capacitors 74 and 75 and the inductor 8 are electrically connected in series between the electrode 63 and the electrode 64. Note that also in the third high acoustic impedance layer 371 of the third acoustic impedance layer 37, the third high acoustic impedance layer 371 is electrically connected to the second high acoustic impedance layers 351 and 361. In addition, the third high acoustic impedance layer 371 is made of the same or substantially the same material as the second high acoustic impedance layers 351 and 361.

Figure 8:
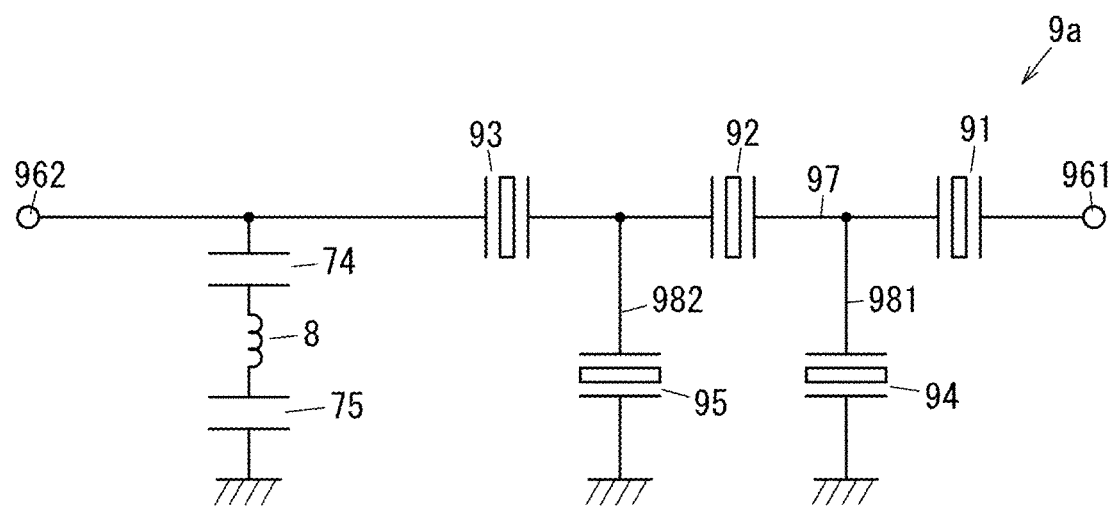
FIG. 8 is a circuit diagram of a ladder filter according to the second preferred embodiment of the present invention.

The acoustic wave device 1a according to the second preferred embodiment is preferably used for the ladder filter 9a as shown in FIG. 8. The ladder filter 9a including the acoustic wave device 1a according to the second preferred embodiment will be described below.

The ladder filter 9a includes the series arm circuit 97 and the plurality of parallel arm circuits 981 and 982 (two parallel arm circuits in the shown example) as similar to the ladder filter 9 according to the first preferred embodiment (see FIG. 3). The series arm circuit 97 is electrically connected in series on a first path (a series arm) connecting the input terminal 961 and the output terminal 962. Each of the plurality of parallel arm circuits 981 and 982 is provided on a second path electrically connecting each of nodes on the first path and the ground.

In the ladder filter 9a as described above, for example, the acoustic wave device 1a is used for the series arm resonator closest to the output terminal 962. In other words, the resonator using the piezoelectric layer 4 and the IDT electrode 5 in the acoustic wave device 1a is the series arm resonator 93.

As described above, when the acoustic wave device 1a is used as the series arm resonator 93, the plurality of capacitors 74 and 75 (two capacitors in the shown example) and the inductor 8 are electrically connected in series between a connection point between the series arm resonator 93 and the output terminal 962 and the ground. Thus, a circuit that defines and functions as a short stub can be configured at resonance frequencies of the capacitors 74 and 75 and the inductor 8.

As described above, in the acoustic wave device 1a according to the second preferred embodiment, the third high acoustic impedance layer 373 is provided between the plurality of second high acoustic impedance layers 353 and 363 of the plurality of second acoustic impedance layers 35 and 36. Similarly, the third high acoustic impedance layer 371 is provided between the plurality of second high acoustic impedance layers 351 and 361. Thus, the inductor 8 together with the capacitors 74 and 75 can also be integrally provided with the IDT electrode 5. In other words, the inductor 8 together with the capacitors 74 and 75 can also be integrally provided with the resonator.

As a modification of the second preferred embodiment, the lamination number (the total number of the second high acoustic impedance layers and the second low acoustic impedance layers) of each of the second acoustic impedance layers 35 and 36 is not limited to five layers, but may be three layers, or seven or more layers. In addition, in each of the second acoustic impedance layers 35 and 36, the number of the second high acoustic impedance layers and the number of the second low acoustic impedance layers may be the same. That is, the lamination number of each of the second acoustic impedance layers 35 and 36 may be an even number of layers, for example, two layers, four layers, six layers or the like.

In the second preferred embodiment, all of the plurality of second high acoustic impedance layers 351 and 353 in the second acoustic impedance layer 35 define the second conductive layers having conductivity, but only one of the plurality of second high acoustic impedance layers 351 and 353 may be the second conductive layer. In short, the plurality of second high acoustic impedance layers 351 and 353 may include at least one second conductive layer. Similarly, all of the plurality of second high acoustic impedance layers 361 and 363 in the second acoustic impedance layer 36 define the second conductive layers having conductivity, but only one of the plurality of second high acoustic impedance layers 361 and 363 may be the second conductive layer. In short, the plurality of second high acoustic impedance layers 361 and 363 may include at least one second conductive layer.

In the second preferred embodiment, all of the plurality of third high acoustic impedance layers 371 and 373 in the third acoustic impedance layer 37 define third conductive layers having conductivity, but only one of the plurality of third high acoustic impedance layers 371 and 373 may be the third conductive layer. In short, the plurality of third high acoustic impedance layers 371 and 373 may include at least one third conductive layer.

The plurality of second high acoustic impedance layers 351 and 353 in the second acoustic impedance layer 35 are not limited to being made of the same material, and may be made of different materials. The plurality of second high acoustic impedance layers 361 and 363 in the second acoustic impedance layer 36 are also not limited to being made of the same material, and may be made of different materials. The plurality of third high acoustic impedance layers 371 and 373 in the third acoustic impedance layer 37 are also not limited to being made of the same material, and may be made of different materials.

The plurality of second low acoustic impedance layers 352, 354, and 355 in the second acoustic impedance layer 35 are not limited to being made of the same material, and may be made of different materials. The plurality of second low acoustic impedance layers 362, 364, and 365 in the second acoustic impedance layer 36 are not limited to being made of the same material, and may be made of different materials. The plurality of third low acoustic impedance layers 372, 374, and 375 in the third acoustic impedance layer 37 are not limited to being made of the same material, and may be made of different materials.

The second acoustic impedance layers 35 and 36 are not limited to an example in which the second high acoustic impedance layers 351, 353, 361, and 363 are second conductive layers, and the second low acoustic impedance layers 352, 354, 355, 362, 364, and 365 may define second conductive layers. Similarly, the third acoustic impedance layer 37 is not limited to an example in which the third high acoustic impedance layers 371 and 373 are third conductive layers, and the third low acoustic impedance layers 372, 374, and 375 may define third conductive layers.

In the example shown in FIG. 8, the capacitors 74 and 75 are provided on an output side (between the series arm resonator 93 and the output terminal 962) of the ladder filter 9a, and the second conductive films defining the capacitors 74 and 75 are electrically connected to each other. However, instead of the output side of the ladder filter 9a, at least two capacitors may be provided on an input side (for example, between the input terminal 961 and the series arm resonator 91) of the ladder filter 9a. In this case, at least two second conductive films defining at least two capacitors are electrically connected to each other. Alternatively, at least two capacitors may be provided on each of the input side and the output side of the ladder filter 9a. In this case, an electrode of the capacitor provided on the input side of the ladder filter 9a and an electrode of the capacitor provided on the output side of the ladder filter 9a are not electrically connected to each other.

In the second preferred embodiment, although the first acoustic impedance layer 31, the second acoustic impedance layers 35 and 36, and the third acoustic impedance layer 37 are provided on the substrate 2, the first acoustic impedance layer 31, the second acoustic impedance layers 35 and 36, and the third acoustic impedance layer 37 may be provided on the piezoelectric layer 4 as a modification of the second preferred embodiment. In short, the first acoustic impedance layer 31, the second acoustic impedance layers 35 and 36, and the third acoustic impedance layer 37 may be provided between the substrate 2 and the piezoelectric layer 4.

In this modification, the first acoustic impedance layer 31, the second acoustic impedance layers 35 and 36, and the third acoustic impedance layer 37 are provided on the piezoelectric substrate which defines the piezoelectric layer 4, and then the substrate 2 is laminated so that the first acoustic impedance layer 31, the second acoustic impedance layers 35 and 36, and the third acoustic impedance layer 37 are sandwiched between the piezoelectric layer 4 and the substrate 2. Even in this modification, it is possible to simultaneously form the first acoustic impedance layer 31 overlapping at least a portion of the IDT electrode 5, the second acoustic impedance layers 35 and 36 including conductive layers (second high acoustic impedance layers 353 and 363) that form the capacitors 74 and 75 with the electrodes 63 and 64, and the third acoustic impedance layer 37 that defines the inductor 8, between the substrate 2 and the piezoelectric layer 4.

Each of the first and second preferred embodiments described above is only one of various preferred embodiments of the present invention. The first and second preferred embodiments can be variously modified in accordance with design or the like as long as the object of the present invention can be achieved.

It is apparent that the following features are disclosed in the first and second preferred embodiments and the modifications described above.

An acoustic wave device (1; 1a) according to a preferred embodiment of the present invention includes a substrate (2), a first acoustic impedance layer (31), and a second acoustic impedance layer (32), a piezoelectric layer (4), an IDT electrode (5), and at least one electrode (61, 62; 63, 64). The first acoustic impedance layer (31) and the second acoustic impedance layer (32) are provided on the substrate (2). The piezoelectric layer (4) is provided on the first acoustic impedance layer (31) and the second acoustic impedance layer (32). The IDT electrode (5) is provided on the piezoelectric layer (4). At least a portion of the IDT electrode (5) overlaps the first acoustic impedance layer (31) in a plan view from a thickness direction (first direction D1) of the piezoelectric layer (4). The electrode (61, 62; 63, 64) is provided on the piezoelectric layer (4). At least a portion of the electrode (61, 62; 63, 64) overlaps the second acoustic impedance layer (32) in a plan view from the thickness direction. Each of the first acoustic impedance layer (31) and the second acoustic impedance layer (32, 33; 34, 35) includes a high acoustic impedance layer (first high acoustic impedance layer 311, 313) of at least one layer and a low acoustic impedance layer (first acoustic impedance layer 312, 314, 315) of at least one layer. An acoustic impedance of the low acoustic impedance layer is lower than that of the high acoustic impedance layer. In each of the first acoustic impedance layer (31) and the second acoustic impedance layer (32, 33), the high acoustic impedance layer or the low acoustic impedance layer is electrically conductive. A capacitor (71, 72; 74, 85) is formed by using the conductive layer and the electrode (61, 62; 63, 64) in the second acoustic impedance layer (32, 33; 34, 35). The conductive layer in the first acoustic impedance layer (31) is electrically insulated from the conductive layer in the second acoustic impedance layer (32, 33; 34, 35).

In the acoustic wave device (1; 1a) described above, the conductive layer of the first acoustic impedance layer (31) overlapping at least a portion of the IDT electrode (5) is electrically insulated from the conductive layer of the second acoustic impedance layer (32, 33; 35, 36) overlapping at least a portion of the electrode (61, 62; 63, 64). As compared to a case where a capacitor is a discrete element or a capacitor is formed on a wiring substrate, an overall size of the acoustic wave device (1; 1a) can be reduced while deterioration in characteristics is significantly reduced or prevented.

In the acoustic wave device (1; 1a) described above, the second acoustic impedance layer (32, 33; 35, 36) overlaps at least a portion of the electrode (61, 62; 64, 65) in the thickness direction (first direction D1) of the substrate (2), and a plurality of high acoustic impedance layers (second high acoustic impedance layers 321, 323, 331, 333; 351, 353, 361, 363) of the second acoustic impedance layer (32, 33; 35, 36) include conductive layers. Thus, the conductive layer in the second acoustic impedance layer (32, 33; 34, 35) can be used as the other electrode that is different from the electrode (61, 62; 63, 64) in the capacitor (71, 72; 74, 75). As a result, in comparison with a case where the other electrode of the capacitor is provided separately from the conductive layer in the second acoustic impedance layer (32, 33; 34, 35), the capacitor (71, 72; 74, 75) are able to be smaller in the thickness direction (first direction D1) of the substrate (2).

In an acoustic wave device (1; 1a) according to a preferred embodiment of the present invention, a plurality of high acoustic impedance layers (first high acoustic impedance layers 311, 313) of the first acoustic impedance layer (31) are provided with respect to the acoustic wave device according to the first aspect. A plurality of low acoustic impedance layers (first low acoustic impedance layers 312, 314, 315) of the first acoustic impedance layer (31) are provided. The plurality of high acoustic impedance layers of the first acoustic impedance layer (31) and the plurality of low acoustic impedance layers of the first acoustic impedance layer (31) are alternately arranged layer by layer in the thickness direction (first direction D1).

In an acoustic wave device (1; 1a) according to a preferred embodiment of the present invention, a plurality of high acoustic impedance layers (second high acoustic impedance layers 321, 323, 331, 333; 351, 353, 361, 363) of the second acoustic impedance layer (32) are provided. A plurality of low acoustic impedance layers (second acoustic impedance layers 322, 324, 325, 332, 334, 335; 352, 354, 355, 362, 364, 365) of the second acoustic impedance layer (32) are provided. The plurality of high acoustic impedance layers of the second acoustic impedance layer (32, 33; 35, 36) and the plurality of low acoustic impedance layers of the second acoustic impedance layer (32, 33; 35, 36) are alternately arranged layer by layer in the thickness direction (first direction D1).

In an acoustic wave device (1; 1a) according to a preferred embodiment of the present invention, the first acoustic impedance layer (31) includes a conductive layer as the high acoustic impedance layer (first high acoustic impedance layer 311, 313). The second acoustic impedance layer (32, 33; 35, 36) includes a conductive layer as the high acoustic impedance layer (second high acoustic impedance layer 321, 323, 331, 333; 351, 353; 361, 363).

In an acoustic wave device (1; 1a) according to a preferred embodiment of the present invention, a plurality of electrodes (61, 62; 63, 64) are provided, with respect to the acoustic wave device according to any one of the first aspect to the fourth aspect. A plurality of second acoustic impedance layers (32, 33; 35, 36) are provided corresponding one-to-one to the plurality of electrodes (61, 62; 63, 64). At least two of a plurality of conductive layers (the plurality of second high acoustic impedance layers 321, 323, 331, 333; 351, 353, 361, 363) included in the plurality of second acoustic impedance layers (32, 33; 35, 36) are electrically connected to each other.

In the acoustic wave device (1; 1a) described above, at least two of the plurality of conductive layers (plurality of second high acoustic impedance layers 321, 323, 331, 333;

351, 353, 361, 363) in the plurality of second acoustic impedance layers (32, 33; 35, 36) corresponding to the plurality of electrodes (61, 62, 63, 64) are electrically connected to each other. Thus, at least two capacitors (71, 72; 74, 75) can be easily formed.

In an acoustic wave device (1a) according to a preferred embodiment of the present invention, a conductive layer (third high acoustic impedance layer 371, 373) defining an inductor (8) is provided between at least two of the plurality of conductive layers (plurality of second high acoustic impedance layers 351, 353, 361, 363) of the plurality of second acoustic impedance layers (35, 36).

In the acoustic wave device (1a) described above, the conductor layer (third high acoustic impedance layer 371, 373) is provided between at least two of the plurality of conductive layers (plurality of second high acoustic impedance layers 351, 353, 361, 363) of the plurality of second acoustic impedance layers (35, 36). As a result, the inductor (8) together with the capacitor (74, 75) can also be integrally provided with the IDT electrode (5). In other words, the inductor (8) together with the capacitor (74, 75) can also be formed integrally with a resonator.

In an acoustic wave device (1; 1a) according to a preferred embodiment of the present invention, the plurality of conductive layers (plurality of second high acoustic impedance layers 321, 323, 331, 333; 351, 353, 361, 363) of the plurality of second acoustic impedance layers (32, 33; 35, 36) are made of the same or substantially the same material.

In the acoustic wave device (1; 1a) described above, the plurality of conductive layers (plurality of second high acoustic impedance layers 321, 323, 331, 333; 351, 353, 361, 363) are made of the same or substantially the same material. Thus, the plurality of second acoustic impedance layers (32, 33; 35, 36) can be easily formed.

In an acoustic wave device (1; 1a) according to a preferred embodiment of the present invention, the conductive layer (first high acoustic impedance layer 311, 313) of the first acoustic impedance layer (31) is made of the same or substantially the same material as the conductive layers (plurality of second high acoustic impedance layers 321, 323, 331, 333; 351, 353, 361, 363) of the second acoustic impedance layer (32, 33; 35, 36).

In the acoustic wave device (1; 1a) described above, the conductive layer (first high acoustic impedance layer 311, 313) of the first acoustic impedance layer (31) and the conductive layers (plurality of second high acoustic impedance layers 321, 323, 331, 333; 351, 353, 361, 363) of the second acoustic impedance layer (32, 33; 35, 36) are made of the same or substantially the same material. Thus, the first acoustic impedance layer (31) and the second acoustic impedance layer (32, 33; 35, 36) can be easily formed.

In an acoustic wave device (1; 1a) according to a preferred embodiment of the present invention, when a wave length of an acoustic wave determined by an electrode finger pitch (P1) of the IDT electrode (5) is defined as λ, a thickness of the piezoelectric layer (4) is equal to or smaller than about 1λ.

In an acoustic wave device (1; 1a) according to a preferred embodiment of the present invention, the acoustic wave is a plate wave.

An acoustic wave device (ladder filter 9; 9a) according to a preferred embodiment of the present invention includes a series arm circuit (97) and a parallel arm circuit (981, 982). The series arm circuit (97) is provided on a first path electrically connecting an input terminal (961) and an output terminal (962). The parallel arm circuit (981, 982) is provided on a second path electrically connecting a node on the first path and the ground. The series arm circuit (97) includes a plurality of series arm resonators (91 to 93). The parallel arm circuit (981, 982) includes a parallel arm resonator (94, 95). At least one resonator among the plurality of series arm resonators (91 to 93) and the parallel arm resonator (94, 95) include the piezoelectric layer (4) and the IDT electrode (5).

In an acoustic wave device (ladder filter 9) according to a preferred embodiment of the present invention, the resonator including the piezoelectric layer (4) and the IDT electrode (5) is the series arm resonator (93) which is electrically connected closest to the output terminal (962) on the first path among the plurality of series arm resonators (91 to 93). The capacitor (71, 72) is provided on the first path between the output terminal (962) and the series arm resonator (93) which is electrically connected closest to the output terminal (962) on the first path.

A method for manufacturing an acoustic wave device (1; 1a) according to a preferred embodiment of the present invention includes preparing a substrate (2) and a piezoelectric layer (4). The method for manufacturing the acoustic wave device (1; 1a) includes forming a first acoustic impedance layer (31) and a second acoustic impedance layer (32, 33; 35, 36) between the substrate (2) and the piezoelectric layer (4). The first acoustic impedance layer (31) includes a conductive layer (first high acoustic impedance layer 311, 313) of at least one layer. The second acoustic impedance layer (32, 33; 35, 36) includes a conductive layer (second high acoustic impedance layer 321, 323, 331, 333; 351, 353, 361, 363) of at least one layer. The method for manufacturing the acoustic wave device (1; 1a) includes forming an IDT electrode (5) at least partially overlapping the first acoustic impedance layer (31), and forming at least one electrode (61, 62; 63, 64) at least partially overlapping the second acoustic impedance layer (32, 33; 35, 36), in a plan view from a thickness direction (a first direction D1) of the substrate (2) on the piezoelectric layer (4). In the forming of the first acoustic impedance layer (31) and the second acoustic impedance layer (32), forming a high acoustic impedance layer (first high acoustic impedance layer 311, 313, second high acoustic impedance layer 321, 323, 331, 333; 351, 353, 361, 363) and forming a low acoustic impedance layer (first low acoustic impedance layer 312, 314, 315, second low acoustic impedance layer 322, 324, 325, 332, 334, 335; 352, 354, 355, 362, 364, 365) having a lower acoustic impedance than that of the high acoustic impedance layer are repeated at least once for each forming process. In the forming of the first acoustic impedance layer (31) and the second acoustic impedance layer (32, 33; 34, 35), a conductive layer (first high acoustic impedance layer 311, 313) in the first acoustic impedance layer (31) and a conductive layer (second high acoustic impedance layers 321, 323, 331, 333; 351, 353, 361, 363) in the second acoustic impedance layer (32, 33; 35, 36) are electrically insulated from each other. In the forming of the electrode (61, 62; 63, 64, a capacitor (71, 72; 74, 85) is formed by using the conductive layer in the second acoustic impedance layer (32, 33; 34, 35) and the electrode (61, 62; 63, 64).

In the method for manufacturing the acoustic wave device (1; 1a) described above, in the forming of the second acoustic impedance layer (32, 33; 34, 35), the conductive layer is formed at a position facing the electrode (61, 62; 63, 64) in the thickness direction (first direction D1) of the substrate (2). As a result, the capacitor (71, 72; 74, 75) can be manufactured in the same process as a resonator, so that a manufacturing process of the acoustic wave device (1; 1a) can be simplified as compared to a case where a resonator and a capacitor are separately manufactured.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a substrate;
a first acoustic impedance layer and a second acoustic impedance layer provided on the substrate;
a piezoelectric layer provided on the first acoustic impedance layer and the second acoustic impedance layer;
an interdigital transducer (IDT) electrode provided on the piezoelectric layer, and at least partially overlapping the first acoustic impedance layer in a plan view from a thickness direction of the piezoelectric layer; and
at least one electrode provided on the piezoelectric layer, and at least partially overlapping the second acoustic impedance layer in a plan view from the thickness direction; wherein
the second acoustic impedance layer is arranged side by side with the first acoustic impedance layer in a direction orthogonal or substantially orthogonal to the thickness direction;
each of the first acoustic impedance layer and the second acoustic impedance layer includes:
a high acoustic impedance layer including at least one layer; and
a low acoustic impedance layer including at least one layer having a lower acoustic impedance than an acoustic impedance of the high acoustic impedance layer;
in each of the first acoustic impedance layer and the second acoustic impedance layer, at least one of the high acoustic impedance layer and the low acoustic impedance layer is a conductive layer;
a capacitor is defined by the conductive layer in the second acoustic impedance layer and the at least one electrode; and
the conductive layer in the first acoustic impedance layer is electrically insulated from the conductive layer in the second acoustic impedance layer.

2. The acoustic wave device according to claim 1, further comprising:
a plurality of electrodes; and
a plurality of the second acoustic impedance layers corresponding one-to-one to the plurality of electrodes; wherein
the at least one electrode includes the plurality of electrodes; and
at least two of a plurality of conductive layers included in the plurality of second acoustic impedance layers are electrically connected to each other.

3. The acoustic wave device according to claim 2, wherein a conductive layer that defines an inductor is provided between at least the two of the plurality of conductive layers of the plurality of second acoustic impedance layers.

4. The acoustic wave device according to claim 2, wherein the plurality of conductive layers of the plurality of second acoustic impedance layers include a same or substantially same material.

5. The acoustic wave device according to claim 1, further comprising:
a plurality of the high acoustic impedance layers of the first acoustic impedance layer; and
a plurality of the low acoustic impedance layers of the first acoustic impedance layer; wherein
the plurality of high acoustic impedance layers of the first acoustic impedance layer and the plurality of low acoustic impedance layers of the first acoustic impedance layer are alternately provided layer by layer in the thickness direction.

6. The acoustic wave device according to claim 5, wherein the plurality of high acoustic impedance layers of the first acoustic impedance layer and the plurality of low acoustic impedance layers of the first acoustic impedance layer are laminated.

7. The acoustic wave device according to claim 1, further comprising:
a plurality of the high acoustic impedance layers of the second acoustic impedance layer; and
a plurality of the low acoustic impedance layers of the second acoustic impedance layer; wherein
the plurality of high acoustic impedance layers of the second acoustic impedance layer and the plurality of low acoustic impedance layers of the second acoustic impedance layer are alternately provided layer by layer in the thickness direction.

8. The acoustic wave device according to claim 7, wherein the plurality of high acoustic impedance layers of the second acoustic impedance layer and the plurality of low acoustic impedance layers of the second acoustic impedance layer are laminated.

9. The acoustic wave device according to claim 1, wherein
a wave length of an acoustic wave determined by an electrode finger pitch of the IDT electrode is defined as $\lambda$; and
a thickness of the piezoelectric layer is equal to or smaller than about $1\lambda$.

10. The acoustic wave device according to claim 9, wherein the acoustic wave is a plate wave.

11. The acoustic wave device according to claim 1, further comprising:
a series arm circuit provided on a first path electrically connecting an input terminal and an output terminal; and
a parallel arm circuit provided on a second path electrically connecting a node on the first path and a ground; wherein
the series arm circuit includes a plurality of series arm resonators;
the parallel arm circuit includes a parallel arm resonator; and
at least one resonator among the plurality of series arm resonators and the parallel arm resonator includes the piezoelectric layer and the IDT electrode.

12. The acoustic wave device according to claim 11, wherein
the resonator including the piezoelectric layer and the IDT electrode is a series arm resonator connected closest to the output terminal on the first path among the plurality of series arm resonators; and
the capacitor is provided on the first path between the output terminal and the series arm resonator connected closest to the output terminal on the first path.

13. The acoustic wave device according to claim 1, wherein
the first acoustic impedance layer includes the conductive layer as the high acoustic impedance layer; and
the second acoustic impedance layer includes the conductive layer as the high acoustic impedance layer.

14. The acoustic wave device according to claim 1, wherein the conductive layer of the first acoustic impedance layer include a same or substantially same material as the conductive layer of the second acoustic impedance layer.

15. The acoustic wave device according to claim 1, wherein the acoustic wave device is a ladder filter.

16. The acoustic wave device according to claim 1, wherein:
the high acoustic impedance layer includes at least one of W and Pt; and
the low acoustic impedance layer includes an insulating material.

17. A method for manufacturing an acoustic wave device, the method comprising:
preparing a substrate and a piezoelectric layer;
forming a first acoustic impedance layer including at least one conductive layer and a second acoustic impedance layer including at least one conductive layer between the substrate and the piezoelectric layer; and
forming an interdigital transducer (IDT) electrode at least partially overlapping the first acoustic impedance layer and forming at least one electrode at least partially overlapping the second acoustic impedance layer, in a plan view from a thickness direction of the substrate on the piezoelectric layer; wherein
the second acoustic impedance layer is formed side by side with the first acoustic impedance layer in a direction orthogonal or substantially orthogonal to the thickness direction;
in the forming of the first acoustic impedance layer and the second acoustic impedance layer, forming a high acoustic impedance layer and forming a low acoustic impedance layer having a lower acoustic impedance than an acoustic impedance of the high acoustic impedance layer are repeated at least once for each forming;
the conductive layer in the first acoustic impedance layer and the conductive layer in the second acoustic impedance layer are electrically insulated from each other; and
in the forming of the at least one electrode, a capacitor is defined by the conductive layer in the second acoustic impedance layer and the at least one electrode.

* * * * *